United States Patent [19]
Dasgupta

[11] Patent Number: 6,084,465
[45] Date of Patent: Jul. 4, 2000

[54] METHOD FOR TIME CONSTANT TUNING OF GM-C FILTERS

[75] Inventor: Uday Dasgupta, Singapore, Singapore

[73] Assignee: Tritech Microelectronics, Ltd., Singapore, Singapore

[21] Appl. No.: 09/072,341

[22] Filed: May 4, 1998

[51] Int. Cl.$^7$ ...................................................... H03K 5/00
[52] U.S. Cl. ........................... 327/554; 327/553; 327/552
[58] Field of Search ................................... 327/552, 554, 327/94, 553, 561, 336, 337; 330/9; 333/172

[56] References Cited

U.S. PATENT DOCUMENTS

| | | | |
|---|---|---|---|
| 5,325,070 | 6/1994 | McGinn | 330/256 |
| 5,384,501 | 1/1995 | Koyama et al. | 327/336 |
| 5,530,399 | 6/1996 | Chambers et al. | 327/561 |
| 5,559,470 | 9/1996 | Laber et al. | 330/252 |

*Primary Examiner*—Dinh T. Le
*Attorney, Agent, or Firm*—George O. Saile; Stephen B. Ackerman

[57] ABSTRACT

In this invention a time constant tuning circuit is described in which a reference clock frequency is used to adjust the gm of a transconductor and as a result the time constant of the circuit. This is done by charging a capacitor to a voltage with the current output of a transconductor during a clock period and comparing the voltage charge with another voltage. The error voltage from the comparison is used to control the gm of the transconductor. Changing the clock period changes the gm required to charge the capacitor to a voltage to satisfy the comparison. Thus the filter time constants are directly proportional to the reference clock; and therefore, are independent of process variations. The time constants can be varied by varying the clock frequency and is achieved without the use of a PLL. The output the time constant tuning circuit can be used to tune the time constants of other gm-c filters using similar transconductors and capacitors.

17 Claims, 7 Drawing Sheets

METHOD FOR TIME CONSTANT TUNING OF GM-C FILTERS

BACKGROUND OF THE INVENTION

1. Field of Invention

This invention relates to electronic filters and in particular the tuning of gm-C filters.

2. Description of Related Art

Filters using transconductors and capacitors are often called "gm-C" filters. The transconductor is a circuit that has a voltage as an input and a current as an output. Most of the integrated gm-C filters use transconductance tuning or transconductance fixing with an external precision resistor. This method of tuning does not provide any compensation for process variations of the on chip capacitors; and therefore, the filter time constant is not process independent. There exists other methods of time constant tuning using phase locked loops that can keep the time constant tuning process independent, but these methods use analog circuits which require large silicon surfaces to implement and dissipate large amounts of power.

In U.S. Pat. No. 5,325,070 (McGinn) a transconductance gain amplifier is described that reduces the effects of temperature changes of on-chip resistors on the amplifier cut off frequency. In U.S. Pat. No. 5,384,501 (Koyama et al.) a differential amplifier is described in which a variable resistance in the form of a field effect transistor is connected between the differential input pair of the amplifier to provide a means to change the transconductance and the time constant of the differential amplifier. In U.S. Pat. No. 5,559,470 (Laber et al.) a high frequency continuous time filter using an active integrator and a transconductor stage is described which is insensitive to process variations and parasitic capacitance. The filter uses an external precision resistor to set the transconductance and a poly-fuse wafer-sort trim technique to remove capacitor process tolerances.

A simple method to achieve time constant tuning that is independent of process variations is needed that uses a variable mechanism that is independent of the circuitry producing the tuned time constant. The before mentioned prior art uses external resistance to adjust for process variations and to set the transconductance of the circuitry. An entirely integrated solution in which the transconductance and circuit time constant can be tuned by varying an external signal provides a means to achieve the tuning independent of process and process variations. To this end, the technique described in this invention provides a means to accomplish time constant tuning using simple circuitry without the use of phase locked loops, or time consuming polysilicon fuse trimming and subsequent testing.

SUMMARY OF THE INVENTION

In this invention is described a scheme in which a feedback loop is used to adjust the transconductance of a transconductor such that the time constant of the circuit is determined by the period of the a clock. A transconductor is a circuit in which a voltage input creates a current output such that Iout=gm×Vin where gm is the transconductance. The output current of the transconductor is used to charge a capacitor during a clock period to produce a voltage on the capacitor of $$V_C = \frac{gm}{C} k V_R T$$

where $V_C$ is the voltage on the capacitor, C is the capacitance of the capacitor, $kV_R$ is an input voltage to the transconductor, k is a design constant, and T is the time period of the clock. The capacitor voltage is compared to a reference voltage, $V_R$, and the resulting error voltage is used to control the transconductance, gm, such as to make $$V_C = V_R = \frac{gm}{C} k V_R T.$$

From this equation it can be seen that $$\frac{C}{gm} = kT,$$

or the time constant, $$\frac{C}{gm},$$

is proportional to a multiple of the clock period.

In a circuit of this invention a voltage is connected to the input of a transconductor. The output of the transconductor is used to charge two identical capacitors during separate clock periods. The capacitor voltage is used to compare with a reference voltage to create an error voltage to adjust the transconductance, gm, of the transconductor. The transconductor output current charges a first capacitor during a time period of a clock. Then the voltage is held on the first capacitor for two clock periods while a second capacitor is discharged for one clock period and then charged for the second clock period. Similar to the first capacitor, the voltage is held for two clock cycles on the second capacitor while the first capacitor undergoes discharge and recharging. During the time the voltage is held on each capacitor, each voltage is connected to an input to a differential amplifier and compared to a reference voltage. The output of the differential amplifier is used to control the gm of the transconductor such that voltage on the capacitor is the same as the reference voltage.

In a second circuit of this invention the transconductor charges two pairs of identical capacitors, each for one clock period in four time periods. In this second circuit the output offset current of the transconductor is canceled from the results of the time constant tuning. The first capacitor of the first pair of capacitors is charged to a voltage in a first time period of the clock. Then the voltage on the capacitor is held for two time periods and discharged during the fourth time period to zero volts. A second capacitor of the first pair of capacitors is discharged to zero volts and charged to a voltage during the second and third period of the clock, respectively. The voltage is held on the second capacitor of the first pair during the first and fourth time periods when the first capacitor is being charged and discharged. A DC voltage resulting from the hold time of the first pair of capacitors is connected to the positive terminal of a differential amplifier. A second pair of capacitors is similarly charged, held and discharged except the voltage to which they are discharged is a reference voltage, $V_R$. A DC voltage resulting from the hold time of the second pair of capacitors is connected to the negative terminal of a differential amplifier. The output of the differential amplifier controls the gm of the transconductor in such a way that the voltage on the first pair of capacitors, $$V_{DI} = \frac{gm}{C}k_1 V_R T + \frac{I_{off}}{C}T,$$

is equal to the voltage on the second pair of capacitors, $$V_{D2} = \frac{gm}{C}k_2 V_R T + \frac{I_{off}}{C}T + V_R.$$

Where $k_1 V_R$ and $k_2 V_R$ are two input voltages to the transconductor, $k_1$ and $k_2$ are two different design constants, and $I_{off}$ is the output offset current of the transconductor. Equating the two voltages yields, $$\frac{C}{gm} = (k_1 - k_2)T$$

where the offset current has been canceled out and the time constant of the circuit is a multiple of the clock period.

A third circuit of this invention is a circuit in which the transconductor charges a single capacitor to two voltages in two different periods of the clock. This eliminates the need to have identical pairs of capacitors. In this third circuit the capacitor voltage is sampled and held by two additional unmatched capacitors in the hold time period just after charging by the output current of a transconductor.

In the third circuit two voltages $k_1 V_R$ and $k_2 V_R$ are connected to the input of a transconductor and selected by switches. The output of the transconductor is connected by means of an output switch to a current summing junction of an operational amplifier. The capacitor to be charged by the output current of the transconductor is in the negative feedback loop of the operational amplifier. Current flowing from the transconductor must flow through the feedback capacitor when the capacitor is the only feedback path of the current summing operational amplifier. Two capacitors connected to the output of the operational amplifiers sample and hold the voltage on the feedback capacitor at two different clock periods. The hold voltages of the two sample and hold capacitors are compared in a differential amplifier, and the output of the differential amplifier controls the gin of the transconductor such that the voltages on the two sample and hold capacitors are the same, $V_{D1} = V_{D2}$. Where $$V_{DI} = -\frac{gm}{C}k_1 V_R T - \frac{I_{off}}{C}T + V_{off},$$

$$V_{D2} = -\frac{gm}{C}k_2 V_R T - \frac{I_{off}}{C}T + V_{off},$$

and $V_{off}$ is the current summing operational amplifier input offset voltage. Equating $V_{D1}$ and $V_{D2}$ yields $$\frac{C}{gm} = (k_1 - k_2)T.$$

The offset voltage and the offset current cancel out and the time constant is proportional to the period of the clock. The output of the differential amplifier that controls the gm of the transconductor can also be used for tuning the time constants of a gm-C filter using similar transconductors and capacitors.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
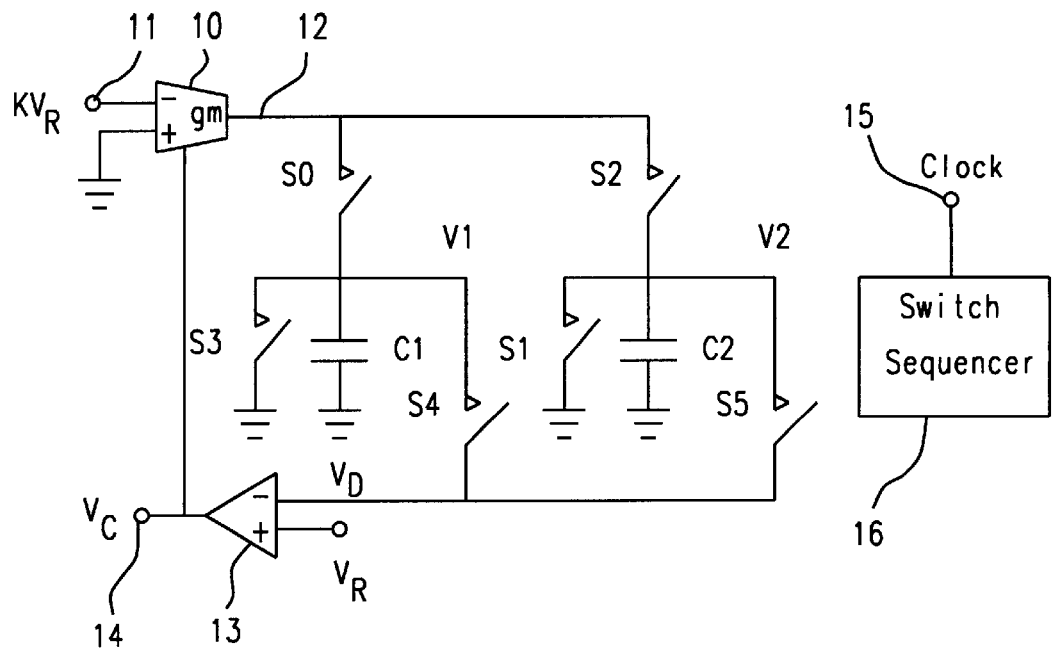
FIG. 1a is a schematic diagram of a first circuit for time constant tuning.

In FIG. 1a is shown a circuit for tuning the transconductance, gm, of a transconductor 10. The transconductor 10 is a circuit that transforms a voltage $kV_R$ at its input 11 into a current at its output 12 proportional to the input voltage, $I_{out} = gm \times kV_R$. Connected to the output of the transconductor 12 through a switch SO is a capacitor C1 connected to circuit ground, and through switch S2 is a capacitor C2 connected to circuit ground. Capacitors C1 and C2 are identical each with the value C. A switch S3 shunts the capacitor C1 for the purpose of resetting the voltage capacitor C1 to zero volts. A switch S4 connects the voltage V1 on capacitor C1 to the negative input to a differential amplifier 13. A switch S1 shunts the capacitor C2 for the purpose of resetting the voltage capacitor C2 to zero volts, A switch S5 connects the voltage V2 on capacitor C2 to the negative input to a differential amplifier 13. Connected to the positive input to the differential amplifier 13 is a reference voltage $V_R$. The output 14 of the differential amplifier 13 is a control voltage $V_C$ that is connected to the transconductor 10. A clock signal 15 is connected to a switch control unit 16 to sequence the switches in the circuit.

Figure 1B:
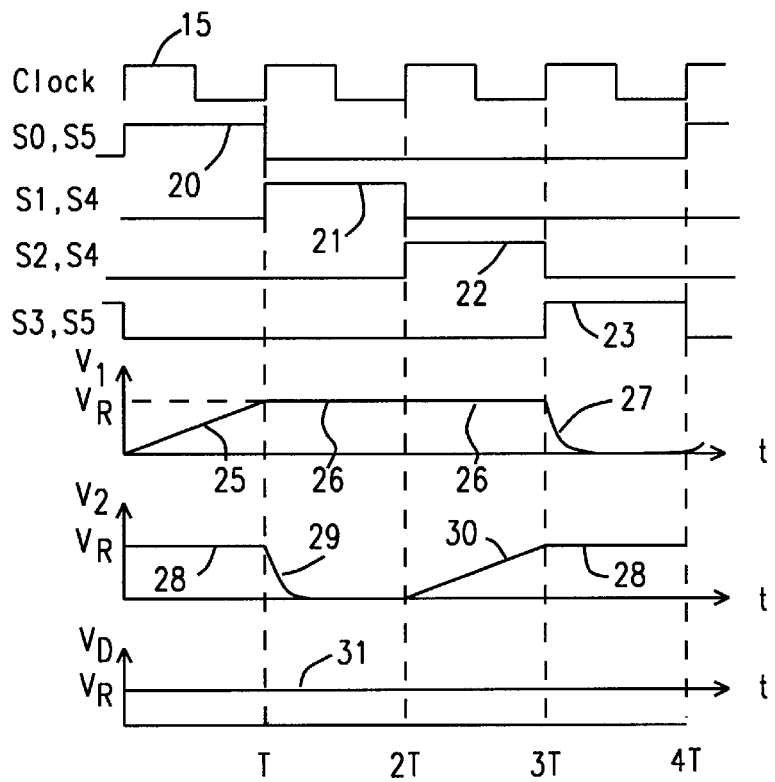
FIG. 1b is a chart of timing signals and voltages for the first circuit for time constant tuning

Referring to FIG. 1b is shown the timing diagram of the switch control unit 16 and the resulting voltage waveforms, V1, V2, and $V_D$. Looking back to FIG. 1a shows the location of the various switches and voltages. In a first period 20 of the clock 15 switches S0 and S5 are closed with all other switches open. Switch S0 connects the output of the transconductor 12 to capacitor C1 and integrates 25 the voltage V1 across the capacitor C1 to a value $V_R$ at the end of the first clock period 20. Switch S5 connects the voltage (V2) 28 held on capacitor C2 to the negative input of the differential amplifier 13 and forming the voltage $V_D$. In the second clock period 21 switches S1 and S 4 are closed with all other switches open. Switch S4 connects the voltage (V1) 26 on capacitor C1 to the negative input of the differential amplifier 13 forming the voltage $V_D$, and switch S1 discharges the capacitor C2 to zero volts 29. During the third clock period 22 switches S2 and S4 are closed with all other switches open. Switch S2 connects the transconductor 10 to the capacitor C2 to integrate to voltage (V2) 30 of the capacitor C2 and switch S4 continues to connect the voltage (V1) 26 of capacitor C1 to the negative input of the differential amplifier 13 and forming the voltage $V_D$. During the fourth clock period 23 switches S3 and S5 are closed with all other switches open. Switch S3 discharges capacitor C1 to zero volts 27 and switch S5 connects voltage (V2) 28 of capacitor C2 to the negative input of the differential amplifier 13 and forming the voltage $V_D$. The voltage VD is compared to a reference voltage $V_R$ in the differential amplifier 13 and the output of the differential amplifier 14 is fed back to the transconductor 10 to control the transconductance, gm, such that $V_D=V_R$. In terms of the input voltage, $kV_R$, to the transconductor $$V_D = V_R = kV_R \times \frac{gm}{C} \times T$$

where T is the length of a clock period. This can be reduced to $$\frac{C}{gm} = kT$$

and means that the time constant, $$\frac{C}{gm},$$

is adjusted to a multiple k of the time period $T$ of the clock.

Figure 2:
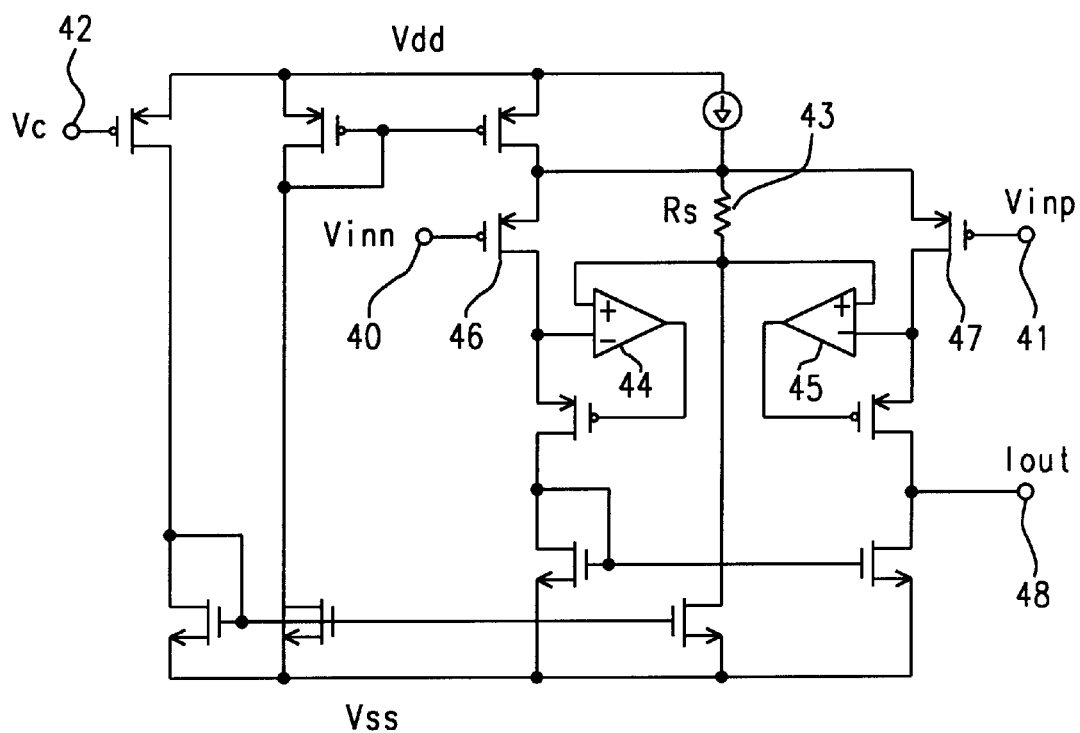
FIG. 2 is a circuit diagram of a transconductor that can be tuned with a voltage.

Referring to FIG. 2, a circuit for a transconductor is shown connected between two voltage rails, $V_{DD}$ and $V_{SS}$. Vinn 40 is the negative input of the transconductor and Vinp 41 is the positive input. A control voltage input $V_C$ 42 controls the current through the resistor $R_S$ 43. The voltage across $R_S$ 43 is used by the two differential amplifiers 44 45 to control the drain-source voltages of the differential input transistors 46 47 to be the same as the voltage across $R_S$ 43. When the drain to source voltage of the two differential input transistors 46 47 is small with respect to the respective gate to source voltages minus the threshold voltage, the input transistors operate in a region where the transconductance of the transistors is proportional to the drain-source voltage and the output 48 is a current proportional the transconductance.

Figure 3A:
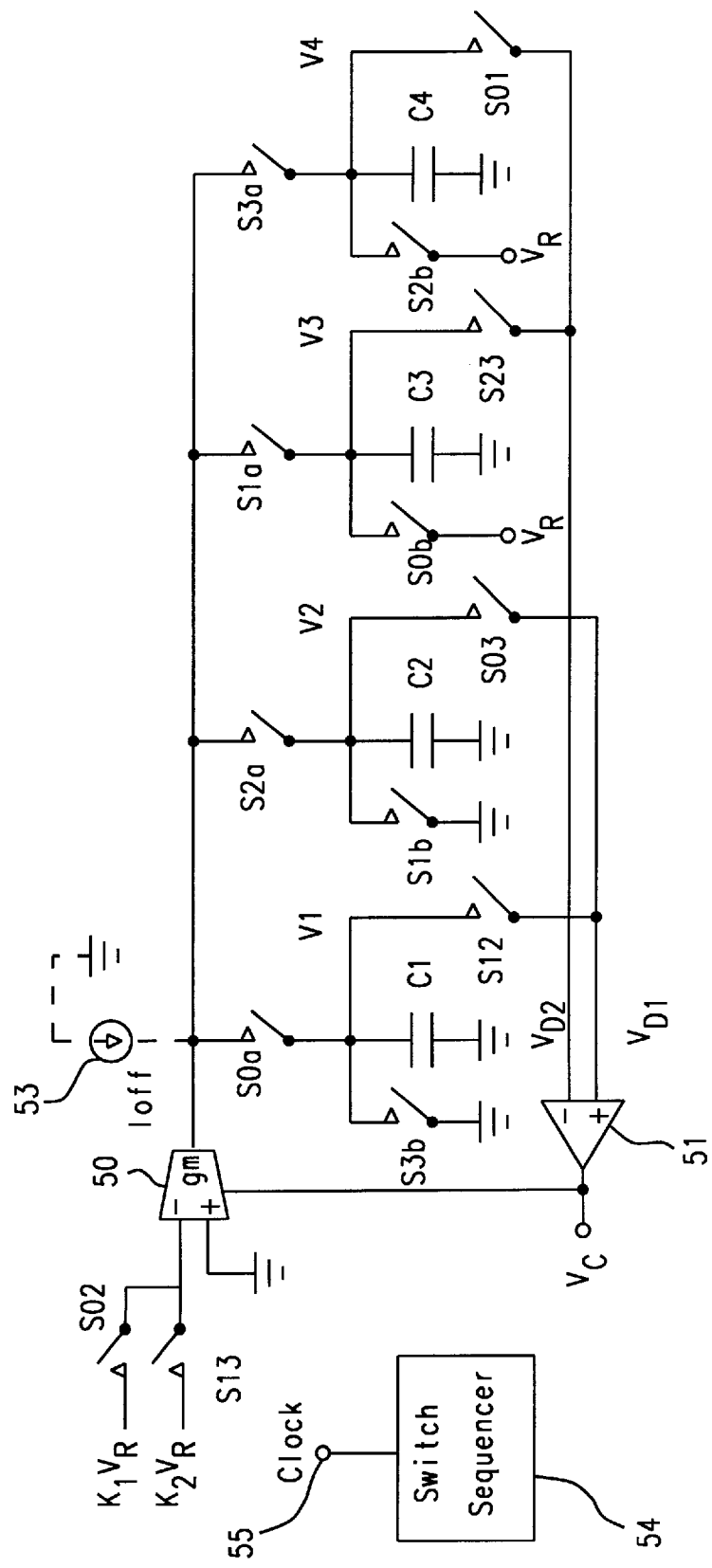
FIG. 3a is a schematic diagram of a second circuit for time constant tuning.

In FIG. 3a is shown a time constant tuning circuit having two pairs of identical capacitors, C1 and C2, and C3 and C4, each of value C and connected to the output of a transconductor 50. The voltage on the first pair of capacitors, V1 and V2, are connected to the positive terminal of a differential amplifier 51 through switches S12 and S03. The voltages on the second pair of capacitors, C3 and C4, are connected to the negative terminal of a differential amplifier 51 through switches S23 and S01. The output of the differential amplifier 51 produces a control voltage $V_C$ and is connected to the transconductor 50 to control the transconductance, gm. Two voltages $k_1V_R$ and $k_2V_R$ are connected to the input of the transconductor 50 through switches S02 and S13. A switch sequencer 54 having a clock input 55 is used to control all switches in the time constant circuit. An offset current $I_{OFF}$ 53 is shown connected to the output of the transconductor 50 to represent any offset current of the transconductor.

Continuing to refer to FIG. 3a, capacitor C1 is connected to the output of the transconductor 50 by switch S0a and is shunted to ground for reset purposes by switch S3b. Capacitor C2 is connected to the output of the transconductor 50 by switch S2a and is shunted to ground for reset purposes by switch S1b. Capacitor C3 is connected to the output of the transconductor 50 by switch S1a and is shunted to a reference voltage $V_R$ for reset purposes by switch S0b. Capacitor C4 is connected to the output of the transconductor 50 by switch S3a and is shunted to a reference voltage $V_R$ for reset purposes by switch S2b.

Figure 3B:
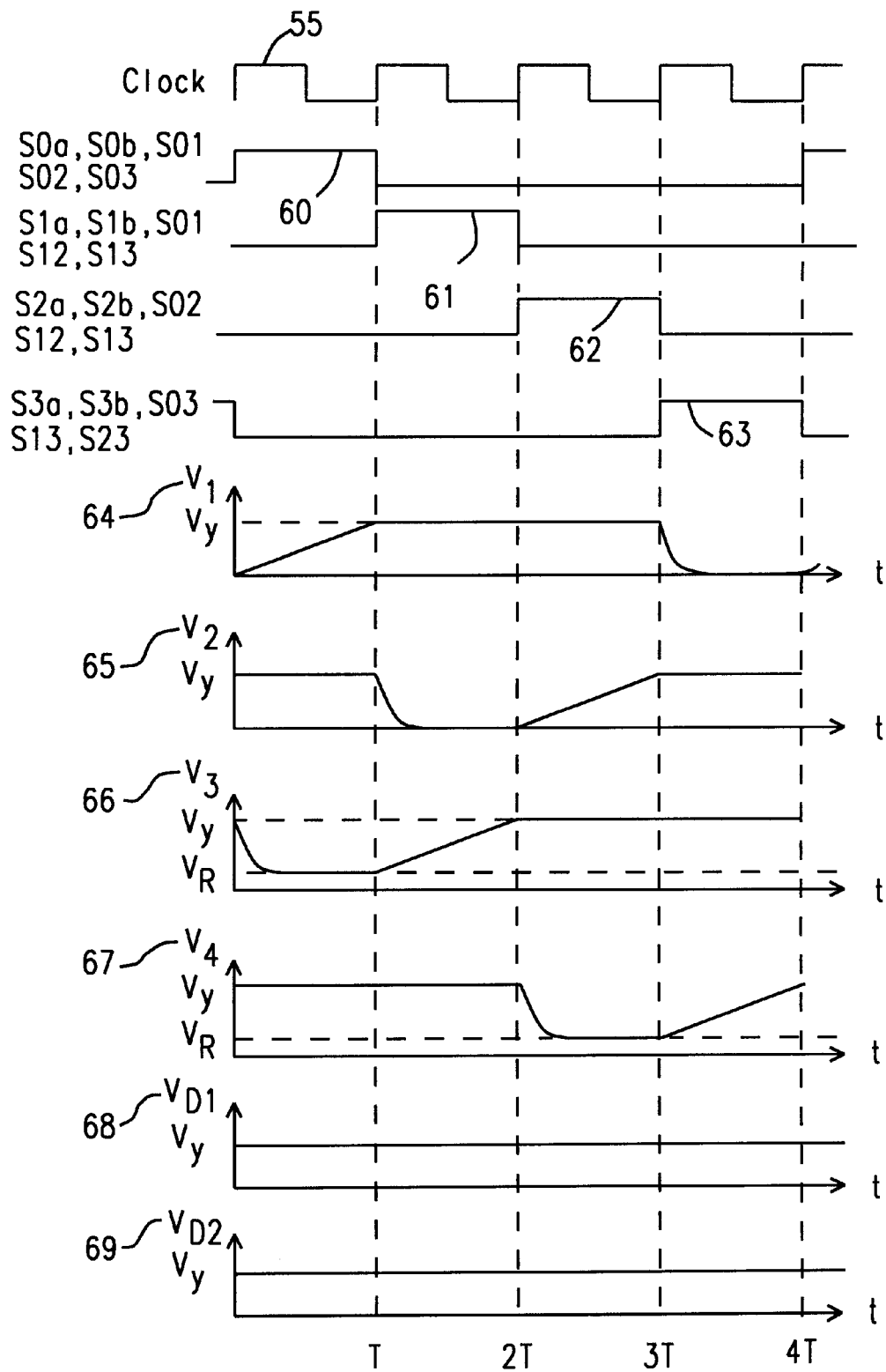
FIG. 3b is a chart of timing signals and voltages for the second circuit for time constant tuning.

Referring to FIG. 3a along with FIG. 3b, a timing diagram of the switch sequencer is shown. In a first period 60 of clock 55 the first capacitor C1 of the first pair of capacitors is connected to the output of the tranconductor 50 by switch S0a; capacitor C3 is reset to a reference voltage $V_R$ by switch S0b; the voltage $V_4$ on capacitor C4 is connected to the negative input to the differential amplifier 51 by switch S01; the voltage $K_1V_R$ is connected to the input of the transconductor 50 by switch S02; and the voltage $V_2$ of capacitor C2 is connected to the positive input terminal of the differential amplifier 51 by switch S03.

Continuing to refer to FIG. 3a along with FIG. 3b, in a second period 61 of clock 55 the first capacitor C3 of the second pair of capacitors is connected to the output of the tranconductor 50 by switch S1a; capacitor C2 is reset to a zero voltage by switch S1b; the voltage $V_4$ on capacitor C4 is connected to the negative input to the differential amplifier 51 by switch S01; the voltage $k_2V_R$ is connected to the input of the transconductor 50 by switch S13; and the voltage $V_1$ of capacitor C1 is connected to the positive input terminal of the differential amplifier 51 by switch S12.

Continuing to refer to FIG. 3a and FIG. 3b, in a third period 62 of clock 55 the second capacitor C2 of the first pair of capacitors is connected to the output of the tranconductor 50 by switch S2a; capacitor C4 is reset to a reference voltage $V_R$ by switch S2b; the voltage $V_1$ on capacitor C1 is connected to the positive input to the differential amplifier 51 by switch S12; the voltage $k_1V_R$ is connected to the input of the transconductor 50 by switch S02; and the voltage $V_3$ of capacitor C3 is connected to the negative input terminal of the differential amplifier 51 by switch S23.

Continuing to refer to FIG. 3a and FIG. 3b, in a forth period 63 of clock 55 the second capacitor C4 of the second pair of capacitors is connected to the output of the tranconductor 50 by switch S3a; capacitor C1 is reset to zero volts by switch S3b; the voltage V2 on capacitor C2 is connected to the positive input to the differential amplifier 51 by switch S03; the voltage $k_2V_R$ is connected to the input of the transconductor 50 by switch S13; and the voltage $V_3$ of capacitor C3 is connected to the negative input terminal of the differential amplifier 51 by switch S23.

Continuing to refer to FIG. 3a and FIG. 3b, the voltage waveform $V_1$ 64 of capacitor C1 caused by the sequencing of switches and the connections of the circuitry of FIG. 3a is shown. In the first period of the clock the voltage on the capacitor C1 is integrated to a value Vy. Then for clock periods two and three the voltage on the capacitor C1 is held at a value of Vy. In the fourth time period the voltage on capacitor C1 is discharged to zero volts. The voltage waveform for $V_2$ 65 is shown with a voltage Vy being held on the capacitor C2 for the first clock period. In the second clock period the capacitor is discharged to zero volts, and in the third clock period the voltage of the capacitor C2 is integrated to a value Vy by connection to the transconductor 50. In the fourth clock period the voltage $V_2$ on capacitor C2 is held at the voltage value Vy.

Continuing to refer to FIG. 3a and FIG. 3b, the voltage wave form $V_3$ 66 of capacitor C3 caused by the sequencing of switches and the connections of the circuitry of FIG. 3a is shown. In the first clock period the voltage $V_3$ on capacitor C3 is reset to a reference voltage $V_R$, and in the second clock period the voltage $V_3$ is integrated from $V_R$ to Vy. During the third and fourth clock periods the voltage $V_3$ is held at the value Vy. The voltage wave form $V_4$ 67 on capacitor C4 is held at a constant value of Vy for first and second clock periods. In the third clock period the $V_4$ on capacitor C4 is reset to a reference voltage $V_R$, and in the fourth clock period the voltage $V_4$ across capacitor C4 is integrated from $V_R$ to Vy by the current from the transconductor 50.

Continuing to refer to FIG. 3a and FIG. 3b, voltage $V_{D1}$ 68 at the positive input of the differential amplifier 51 is a constant value Vy as a result of the complementary wave forms $V_1$ and $V_2$ across the first pair of capacitors C1 and C2. When C1 is being discharged and charged, the voltage Vy on C2 is connected to the positive input to ther differential amplifier 51, and when C2 is being discharged and charged the voltage Vy on C1 is connected to the positive input of the differential amplifier 51. In like manner the voltage $V_{D2}$ 69 at the negative input of the differential amplifier 51 is a constant value Vy as a result of the complementary wave forms $V_3$ and $V_4$ across the second pair of capacitors C3 and C4. When the voltage on C3 is being discharged and charged, the voltage Vy on capacitor C4 is connected to the negative input of the differential amplifier. When the voltage on C4 is being discharged and charged, the voltage Vy on capacitor C3 is connected to the negative input of the differential amplifier.

The circuit of FIG. 3a produces a voltage $$V_{D1} = k_1 V_R \times \frac{gm}{C} T + \frac{I_{off}}{C} T$$

and $$V_{D2} = k_2 V_R \times \frac{gm}{C} T + \frac{I_{off}}{C} T$$

where C=C1=C2=C3=C4. Since the negative feedback loop controls the gm of the transconductor such that $V_{D1}=V_{D2}$ then $$\frac{C}{gm} = (k_1 - k_2)T.$$

The $I_{off}$ term representing the current offset of the transconductor 50 is canceled out and the time constant $$\frac{C}{gm}$$

is proportional to the clock period T with a new constant of proportionality $(k_1-k_2)$.

Figure 4A:
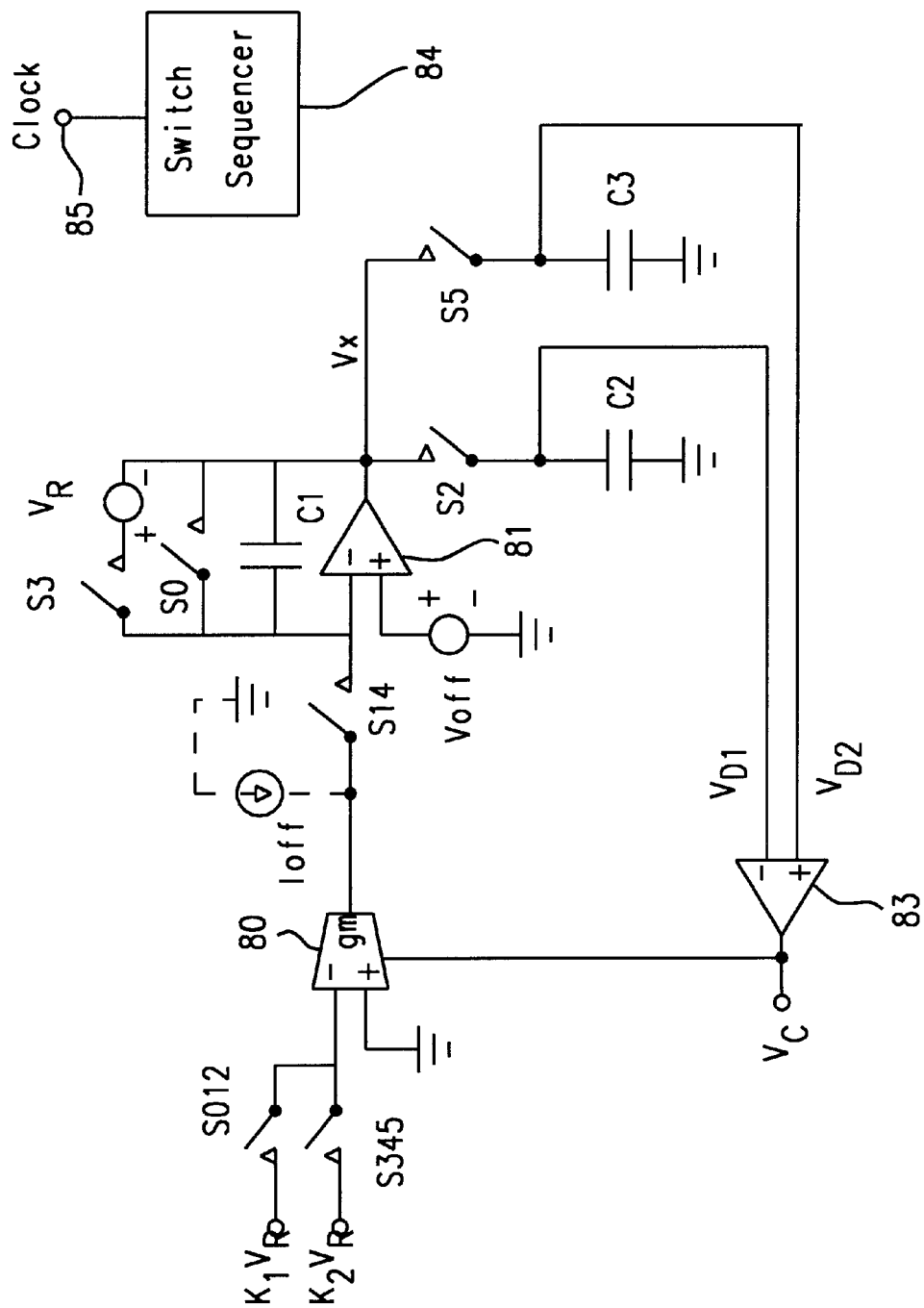
FIG. 4a is a schematic diagram of a third circuit for time constant tuning.

In FIG. 4a is shown a time constant tuning circuit in which only one capacitor C1 is used to integrate a voltage, hold that voltage and discharge the voltage to repeat the cycle. The capacitor is in the feedback loop of a current summing operational amplifier 81 connected to a transconductor 80 by a switch S14. As in the previously described time constant tuning circuits, two charge, hold and discharge cycles are necessary to provide the control signal to adjust the gm of the transconductor. Capacitors C1 and C2 are connected to the output of the current summing operational amplifier by switches S2 and S5. When S2 is closed C2 samples the voltage $V_X$ on C1 and holds that voltage when S2 is open. In like manner, when S5 is closed C3 samples the voltage $V_X$ on C1 and holds that voltage when S5 is open. The voltage $V_{D1}$ from capacitor C2 is connected to the negative input of the differential amplifier 83, and the voltage $V_{D2}$ from capacitor C3 is connected to the positive input of the differential amplifier 83. The voltage output $V_C$ of the differential amplifier 83 is connected to the transconductor 80 to control the transconductance, gm. A voltage $k_1 V_R$ is connected to the negative input of the transconductor 80 by a switch S012, a voltage $k_2 V_R$ is connected to the negative input of the transconductor 80 by switch S345.

Continuing to refer to FIG. 4a, an offset current Ioff is shown at the output of the transconductor 80 representing the output offset current of the transconductor. An offset voltage Voff is shown in the positive input to the current summing operational amplifier and represents the input offset voltage of the amplifier. Connected across the capacitor C1 in the feed back loop of the current summing amplifier 81 is a switch S0 to reset the voltage on the capacitor C1 to zero volts, and also connected across capacitor C1 a voltage $V_R$ connected by switch S3 to reset the voltage on the capacitor to the reference voltage $V_R$. A switch sequencer 84 is shown connected to a clock 85. The sequencer controls the timing of the activation of all switches in the circuit of FIG. 4a.

Figure 4B:
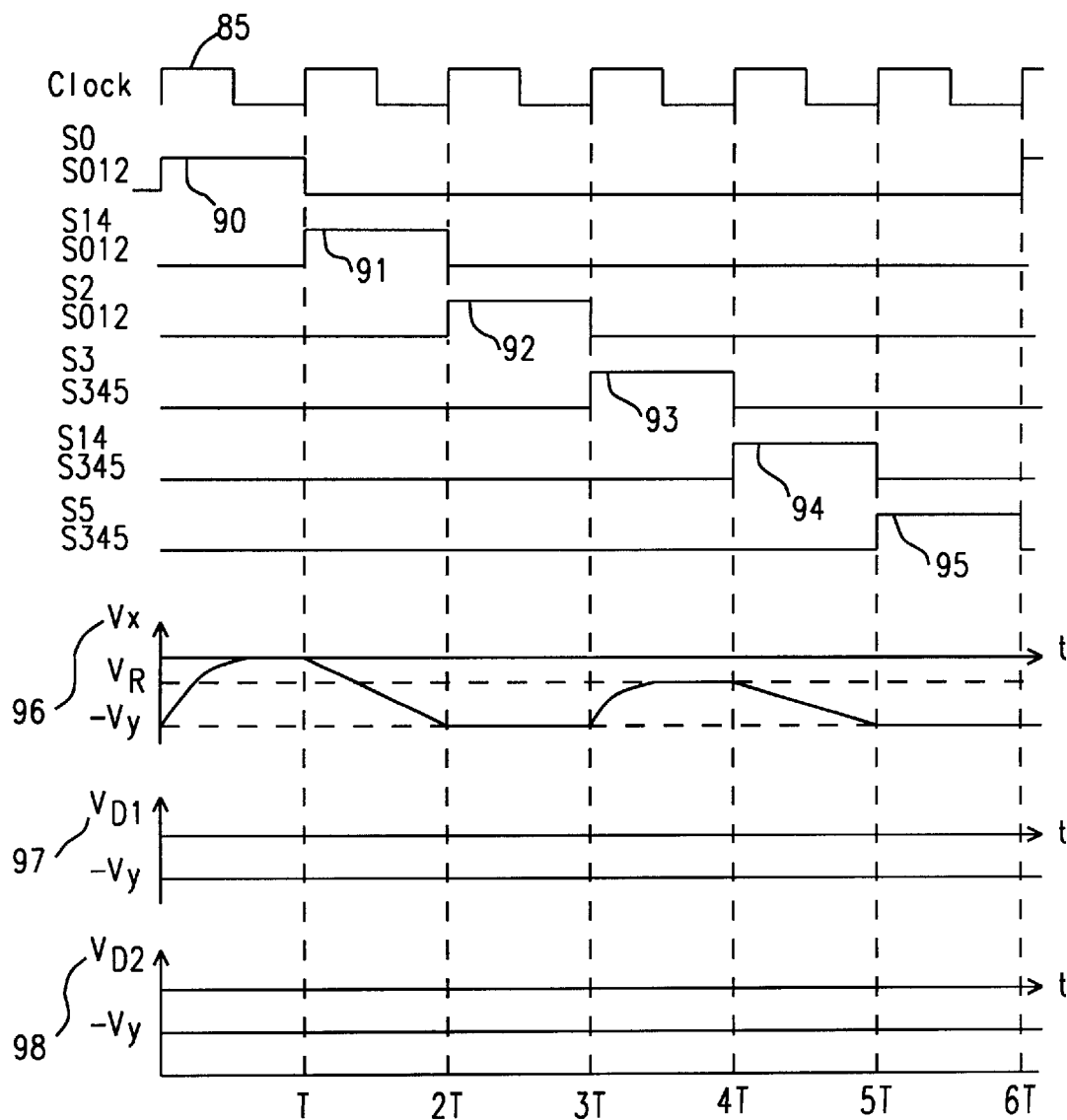
FIG. 4b is a chart of timing signals and voltages for the third circuit for time constant tuning

Referring to FIG. 4b along with FIG. 4a, in a first period 90 of the clock 85 switch S0 is closed to rest the voltage across capacitor C1 to zero volts, switch S012 connects input voltage $k_1 V_R$ to the input of the transconductor 80, and all other switches are open. During the second clock period 91 switch S14 connects the output of the tranconductor 80 to the current summing junction of the operational amplifier 81 to charge the capacitor C1, switch S012 connects $k_1 V_R$ to the input of the transconductor, and all other switches are open. In the third period 92 of the clock switch S2 is closed to allow capacitor C2 to sample the voltage $V_X$ resulting from charging capacitor C1, input voltage $k_1 V_R$ is connected to the input of the transconductor 80, and all other switches are open. In the fourth clock period 93 S3 is closed to reset C1 to a reference voltage $V_R$, switch S345 is closed connecting $k_2 V_R$ to the input of the transconductor 80, and all other switches are open. During the fifth clock period 94 switch S14 is closed connecting the transconductor to the current summing amplifier 81 and charging C1. Switch S345 is closed connecting $k_2 V_R$ to the input of the transconductor 80, and all other switches are open. During time period six 95 switch S5 is closed to allow the voltage $V_X$ at the output of the current summing amplifier 81 to be sampled by the capacitor C3, switch S345 is closed connecting voltage $k_2 V_R$ to the input of the transconductor, and all other switches are open.

Continuing to refer to FIG. 4a and FIG. 4b, the voltage wave form 96 of the of the output voltage $V_X$ of the current summing amplifier 81 is shown in FIG. 4b. During the first clock period the voltage $V_X$ is reset to zero volts, and in the second period $V_X$ is integrated to −Vy. In the third clock period the voltage −Vy is held, and in the fourth period the voltage $V_X$ 96 is reset to $-V_R$. During the fifth time period $V_X$ is integrated from $-V_R$ to −Vy and held at −Vy during the sixth time period. Voltage wave forms $V_{D1}$ 97 and $V_{D2}$ 98 are a constant voltage −Vy resulting from sampling $V_X$ during time periods three and six, and the negative feed back control of the gm of the transconductor 80.

In FIG. 4a the circuit produces a voltage $$V_{D1} = -k_1 V_R \times \frac{gm}{C} T - \frac{I_{off}}{C} T + V_{off}$$

and a voltage $$V_{D2} = -k_2 V_R \times \frac{gm}{C} T - \frac{I_{off}}{C} T - V_R + V_{off}$$

Since the negative feedback look insures that $V_{D1}=V_{D2}$, then $$\frac{C}{gm} = (k_1 - K_2)T.$$

The time constant of the circuit $$\frac{C}{gm}$$

is proportional to the period of the clock with a constant of proportionality being $k_1-k_2$. Both the current offset $I_{off}$ and the voltage offset $V_{off}$ are canceled out of the time constant equation.

Figure 5:
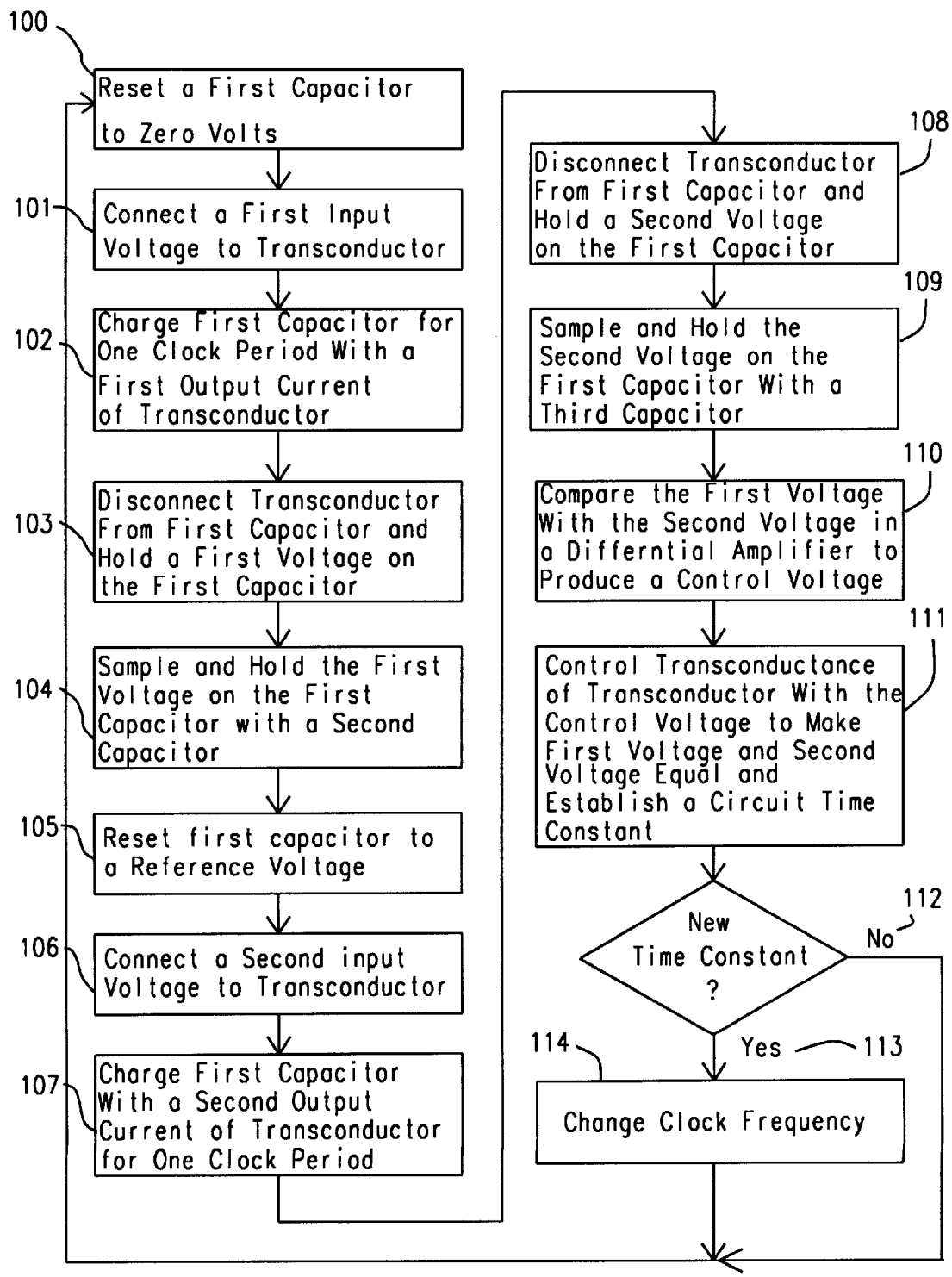
FIG. 5 shows a flow diagram for controlling and adjusting the time constant of a gm-filter.

Referring to FIG. 5, a flow diagram is shown for controlling and adjusting the time constant of a gm-C filter. A first capacitor is reset to zero volts 100, and a first input voltage is connected to a transconductor 101. A first capacitor is charged for one clock period with a first output current of the transconductor 102. The transconductor is then disconnected from the first capacitor, and the first voltage is held on the first capacitor 103. The first voltage is sampled and held by a second capacitor 104. The first capacitor is reset to a reference voltage 105, and a second input voltage is connected to the transconductor 106. The first capacitor is charged with a second output current of the transconductor for one clock period 107. The transconductor is disconnected from the first capacitor and the second voltage is held on the first capacitor 108. The second voltage on the first capacitor is sampled and held by a third capacitor 109. The first voltage held on the second capacitor and the second voltage held on the third capacitor are compared in a differential amplifier to produce a control voltage 110. A transconductance of the transconductor is controlled with the control voltage to make the first voltage and the second voltage equal and in turn establishing a circuit time constant 111. If a new time constant is not desired 112, the process starts over with the first capacitor being reset to zero volts 100. When a new circuit time constant is required 113, the clock is set to a new frequency 114 which changes the time period to charge the first capacitor. The process starts all over again at a new clock frequency, and the first capacitor is reset to zero volts 100.

While the invention has been particularly shown and described with reference to preferred embodiments thereof, it will be understood by those skilled in the art that various changes in form and details may be made without departing from the spirit and scope of the invention.

What is claimed is:

1. A circuit with time constant tuning, comprising:
    a) a transconductor with a voltage input and a current output,
    b) said transconductor connected to a first capacitor and a second capacitor by means of switches controlled by a sequencer under control of a clock,
    c) said current output charges the first capacitor to a first voltage during a first period of said clock and said first voltage held on said first capacitor during a second and a third period of said clock,
    d) said current output charges the second capacitor to a second voltage during said third period of said clock and said second voltage held on said second capacitor during a fourth and said first period of said clock,
    e) said first voltage and said second voltage compared to a reference voltage by a differential amplifier,
    f) said transconductor controlled by output of said differential amplifier in a feedback loop to produce said first voltage on the first capacitor and said second voltage on the second capacitor to be the same as the reference voltage, and
    g) transconductance of the transconductor set by frequency of said clock which in turn sets circuit time constant.

2. The circuit of claim 1, wherein said first voltage on said first capacitor is held while said second voltage on the second capacitor is reset and recharged to said second voltage, and said second voltage on said second capacitor is held while said first voltage on the first capacitor is reset and recharged to said first voltage.

3. The circuit of claim 1, wherein said first voltage is connected to said differential amplifier when being held on said first capacitor; and said second voltage is connected to said differential amplifier when being held on said second capacitor.

4. The circuit of claim 1, wherein said output of said differential amplifier is used to control transconductance of transconductors in filters not a part of said feedback loop to produce a time constant tuning of said filters.

5. A time constant tuning circuit, comprising:
    a) a transconductor connected to a first pair of capacitors and a second pair of capacitors through a set of switches,
    b) said transconductor input connected to a first input voltage through a first input switch and a second input voltage through a second input switch,
    c) said transconductor producing a first output current resulting from the first input voltage and a second output current resulting from the second input voltage,
    d) said first output current charging a first capacitor of the first pair of capacitors to a first voltage during a first clock period and said first voltage held on said first capacitor of said first pair of capacitors for a second clock period and a third clock period,
    e) said first output current charging a second capacitor of the first pair of capacitors to a second voltage during a third clock period and said second voltage held on said second capacitor of said first pair of capacitors for a fourth clock period and said first clock period,
    f) said second output current charging a first capacitor of the second pair of capacitors from a reference voltage to a third voltage during a second clock period and said third voltage held on said first capacitor of said second pair of capacitors for said third clock period and said fourth clock period,
    g) said second output current charging a second capacitor of the second pair of capacitors from said reference voltage to a fourth voltage during a forth clock period and said fourth voltage held on said second capacitor of the second set of capacitors for said first clock period and said second clock period, h) said first voltage and said second voltage combining to provide a first positive DC input to the positive input terminal of a differential amplifier, i) said third voltage and said fourth voltage combining to provide a second positive DC input to the negative input terminal of said differential amplifier, j) output of said differential amplifier controls said transconductor in a feedback loop to produce equal voltages at the inputs of the differential amplifier, and k) said transconductance of the transconductor set by length of said clock periods used to charge capacitors.

6. The circuit of claim 5, wherein any DC offset in the transconductor is canceled by comparing voltages at input to the differential amplifier.

7. The circuit of claim 5, wherein said first voltage on said first capacitor of the first pair of capacitors is held while said second voltage on the second capacitor of the first pair of capacitors is reset and recharged to said second voltage, and said second voltage on said second capacitor of the first pair of capacitors is held while said first voltage on the first capacitor of the first pair of capacitors is reset and recharged to said first voltage.

8. The circuit of claim 5, wherein said third voltage on said first capacitor of the second pair of capacitors is held while said fourth voltage on the second capacitor of the second pair of capacitors is reset and recharged to said fourth voltage, and said fourth voltage on said second capacitor of the second pair of capacitors is held while said third voltage on the first capacitor of the second pair of capacitors is reset and recharged to said third voltage.

9. The circuit of claim 5, wherein said first voltage when being held on said first capacitor of the first pair of capacitors is connected to said positive input of said differential amplifier; and said second voltage when being held on said second capacitor of the first pair of capacitors is connected to said positive input of said differential amplifier.

10. The circuit of claim 5, wherein said third voltage when being held on said first capacitor of the second pair of capacitors is connected to a negative input of said differential amplifier; and said fourth voltage when being held on said second capacitor of the second pair of capacitors is connected to said negative input of said differential amplifier.

11. The circuit of claim 5, wherein said output of said differential amplifier is used to control transconductance of transconductors in filters not a part of said feedback loop to produce a time constant tuning of said filters.

12. A transconductance tuning circuit for time constant control and tuning, comprising:

a) an input to a transconductor connected to a first input voltage through a first input switch and a second input voltage through a second input switch, b) current output of said transconductor connected to a current summing operational amplifier through a first output switch, c) a first capacitor connected in the feedback path of the current summing operational amplifier, d) said first capacitor reset to zero volts during a first time period of a clock by a first feed back switch connected across said capacitor, e) said first capacitor charged by a first current during a second time period of the clock as a result of the first input voltage connected by the first input switch to said transconductor, f) a second capacitor connected to output of said current summing operational amplifier during a third time period of the clock to sample and hold a first voltage of the first capacitor, g) said first capacitor reset by a reference voltage during a fourth time period of the clock, h) said first capacitor charged by a second current during a fifth time period of the clock as a result of the second input voltage connected by the second input switch to said transconductor i) a third capacitor connected to output of said current summing operational amplifier during a sixth time period of the clock to sample and hold a second voltage of the first capacitor, j) voltage of the second capacitor and voltage of the first capacitor compared in a differential amplifier and controlled to be the same by said differential amplifier in a feedback loop controlling transconductance of the transconductor, and k) changing frequency of the clock changes charging time of the first capacitor and changes the transconductance of the transconductor needed to produce a current necessary to charge the first capacitor to a defined voltage level.

13. The transconductance tuning circuit of claim 12, wherein an offset current of the transconductor and an offset voltage of the current summing operational amplifier are canceled out in final results.

14. The transconductance tuning circuit of claim 12, wherein said first capacitor is charged and discharged twice to provide two voltages to be compared by said differential amplifier to control the transconductor.

15. The circuit of claim 12, wherein said output of said differential amplifier is used to control transconductance of transconductors in filters not part of said feedback loop to produce a time constant tuning of said filters.

16. A method for time constant tuning of gm-C filters, comprising:

a) resetting a first capacitor to zero volts, b) connecting a first input voltage to a transconductor, c) charging said first capacitor for one clock period to a first voltage with a first output current of said transconductor, d) disconnecting the transconductor from the first capacitor and holding the first voltage on said first capacitor, e) sampling and holding said first voltage with a second capacitor, f) resetting said first capacitor to a reference voltage, g) connecting a second input voltage to said transconductor, h) charging first capacitor for one clock period to a second voltage with a second output current of said transconductor, i) disconnecting the transconductor from the first capacitor and holding the second voltage on said first capacitor, j) sampling and holding said second voltage with a third capacitor, k) comparing said first voltage with said second voltage to produce a control voltage, l) controlling transconductance of said transconductor with said control voltage in a feedback loop to make the first voltage and the second voltage equal and establishing a circuit time constant, m) looping back to step "a" to maintain circuit time constant, and n) changing frequency of said clock to set a new circuit time constant and looping back to step "a" to create and maintain new circuit time constant.

17. The method in claim 16, wherein connecting said control voltage to other transconductors in gm-C filters not in said feedback loop to adjust time constant of said filters, where said other transconductors are similar in structure to said first transconductor.

* * * * *